United States Patent
Guo

[11] Patent Number: 5,703,392
[45] Date of Patent: Dec. 30, 1997

[54] MINIMUM SIZE INTEGRATED CIRCUIT STATIC MEMORY CELL

[76] Inventor: Jeng-Jong Guo, 2F, No. 8, Alley 36, Hu-Bin 1st Road, Science-Based Industrial Park, Hsin-Chu, Taiwan

[21] Appl. No.: 460,035

[22] Filed: Jun. 2, 1995

[51] Int. Cl.⁶ .................... H01L 29/76; H01L 29/94; H01L 31/062; H01L 31/113
[52] U.S. Cl. .................. 257/392; 257/401; 257/903; 257/904
[58] Field of Search .................. 257/903, 904, 257/392, 393, 401; 365/156

[56] References Cited

U.S. PATENT DOCUMENTS

| | | | |
|---|---|---|---|
| 4,525,811 | 7/1985 | Masuoka | 365/154 |
| 4,866,002 | 9/1989 | Shizukuishi et al. | 437/34 |
| 5,285,096 | 2/1994 | Ando et al. | 257/379 |
| 5,327,002 | 7/1994 | Motoyoshi | 257/380 |
| 5,330,929 | 7/1994 | Pfiester et al. | 437/52 |
| 5,373,170 | 12/1994 | Pfiester et al. | 257/69 |
| 5,486,717 | 1/1996 | Kokubo et al. | 257/385 |

FOREIGN PATENT DOCUMENTS 0522689  1/1993  European Pat. Off. .

*Primary Examiner*—Ngan V. Ngo
*Attorney, Agent, or Firm*—H. C. Lin

[57] ABSTRACT

A semiconductor static memory cell with two cross-coupled inverters and two transmission gates for coupling two bit lines uses all minimum size (gate length and gate width) MOSFETs to achieve minimum area. This minimum dimension is rendered possible by using a higher threshold voltage for the transmission gate MOSFET than the threshold voltage of pull-down MOSFET of the inverter. Different threshold voltages are obtained with selective ion implantation, different gate oxide thicknesses and/or different gate doping.

11 Claims, 2 Drawing Sheets

MINIMUM SIZE INTEGRATED CIRCUIT STATIC MEMORY CELL

INTRODUCTION

This invention is related to integrated circuit memory cells, in particular to static memory cells.

Semicondcutor memory is one of the most widely used integrated circuits today. Semiconductor memories can be subdivided into random-access memory (RAM) and read-only memory (ROM). There are two major types of RAMs, namely: the static memory (SRAM) and the dynamic memory (DRAM). The dynamic memory stores binary data in a capacitance, but needs refreshing periodically to replenish the charge stored in the capacitance. The SRAM does not require refreshing in its operation, but occupies a larger area, because the SRAM cell has more transistors than a DRAM cell. It is desirable to minimize the area of an SRAM cell to achieve high package density.

A SRAM cell generally includes two cross-coupled inverters to form a flip-flop or latch. The inverter can use a polycrystalline silicon thin film load resistance as shown in FIG. 1. The inverter can also be a complementary MOSFET (CMOS) inverter as shown in FIG. 2. In either circuit, low power dissipation can be achieved. In the case of the polycrystalline semiconductor thin film load resistance, a very high value load resistance is used to minimize the load current, utilizing the high sheet resistivity of the polycrystalline silicon thin film. In the case of the CMOS inverter, the pull-up p-channel MOSFET (PMOS) and the pull-down n-channel MOSFET (NMOS) are never turned on at the same time in the steady state condition and therefore the series current is nearly equal to zero.

In FIG. 1, an NMOS 11 with its source connected to ground is pulled up by a load resistor 15 toward a positive power supply VDD to constitute a first inverter. Another NMOS 12 is similarly pulled up by resistor 16 to constitute a second inverter. These two inverters are cross-coupled to each other, such that the node N1 of the first inverter is connected to the gate of the NMOS 12, and the node N2 of the second inverter is connected to the gate of the NMOS 11. The node N1 is connected to a bit line BL through a pass transistor NMOS 13 as a transmission gate, and the node is connected to the complementary bit line $\overline{BL}$ through another pass transistor NMOS 14. The gates of the pass transistors 13 and 14 are connected to a word line WL.

Similarly, the CMOS memory cell shown in FIG. 2 has two CMOS inverters. The first inverter has a PMOS 25 connected in series with an NMOS 21 and a common gate connection. The second inverter has a PMOS 26 connected in series with an NMOS 22 and a common gate connection. The node N1 at the common drain of PMOS 25 and NMOS 21 is connected to the common gate of PMOS 26 and NMOS 22. The node at the common drain of PMOS 26 and NMOS 22 is connected to the common gate of PMOS 25 and NMOS 21. The node N1 is connected to a bit line BL through a pass transistor 23, and the node N2 is connected to a complementary bit line $\overline{BL}$ through another pass transistor 24. The gates of the pass transistors 23 and 24 are connected to a word line WL.

For minimum cell area, it is desirable to make all the MOSFETs of minimum size. However, due to noise margin considerations, it is not feasible to make all the transistors of minimum size. For reliable noise margin, the "b 0" logic level appearing at the node N1 and N2 should be low enough. For a lower voltage drop, the conventional memory cell typically makes the width-to-length ratio of the gates of NMOS 11 or 21 2.5 to 4 times larger than the width-to-length ratio of the NMOS transmission gates 13 or 23. When two transistors have different width-to-length ratios, the two transistors cannot be both of minimum size.

In U.S. Pat. No. 5,047,979, a memory cell of similar channel width was disclosed. However, the channel length was not made equal in order to satisfy the requirement of larger width-to-length ratio of the pull-down NMOS than that of the transmission gate. Thus, a minimum size memory cell was not achieved.

SUMMARY

An object of this invention is to minimize the area of a static memory cell. Another object of this invention is to use minimum dimensions for all the transistors in a MOSFET static memory cell. Still another object of this invention is to use nearly equal width-to-length ratio gates for all the transistors in a MOSFET static memory cell.

These objects are achieved in this invention by using a higher threshold voltage for the transmission gate of the SRAM cell than the threshold voltage for the pull-down MOSFET of the flip-flop, which is coupled to the bit lines through the transmission gates. The higher threshold is achieved by doping the substrate, thickening the gate oxide or doping the gate with appropriate impurities.

These objects are further achieved in this invention by using a lower transconductance parameter KP for the pass transistor than that of the pull-down MOSFET through adjusting the thickness of respective gate oxides.

DETAILED DESCRIPTION OF THE PREFERRED EMBODIMENT

Figure 1:
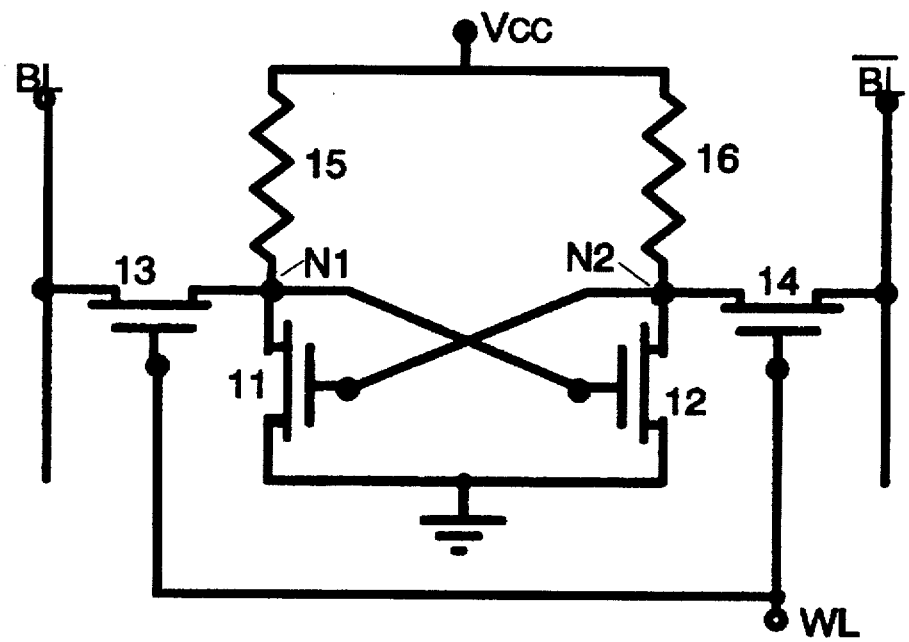
FIG. 1 shows the circuit diagram of a static memory cell using thin film resistors as load devices.
Figure 2:
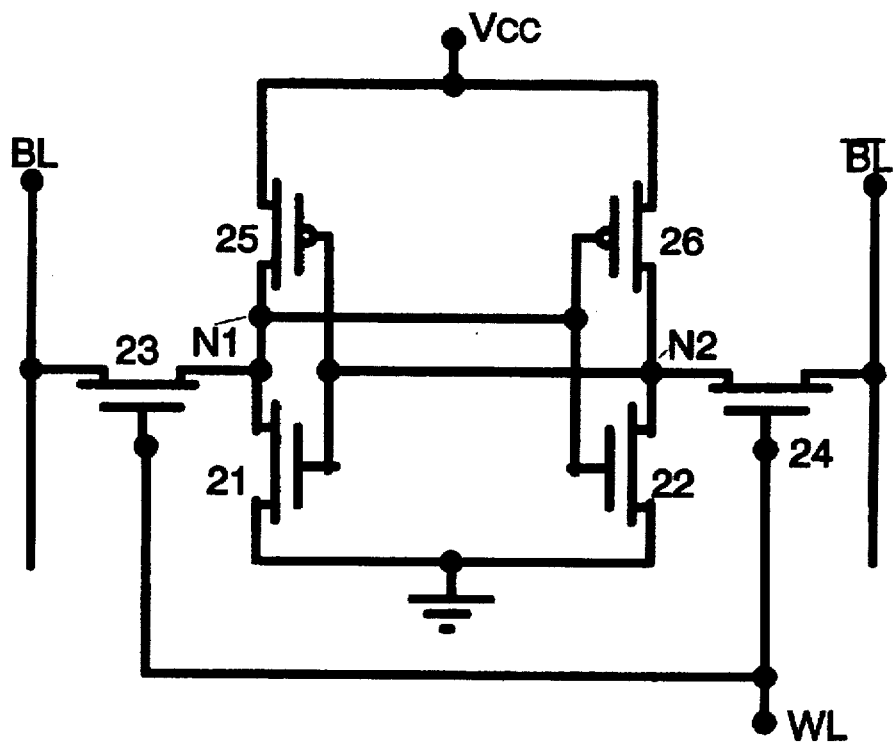
FIG. 2 shows the circuit diagram of static memory cell using CMOS.
Figure 3:
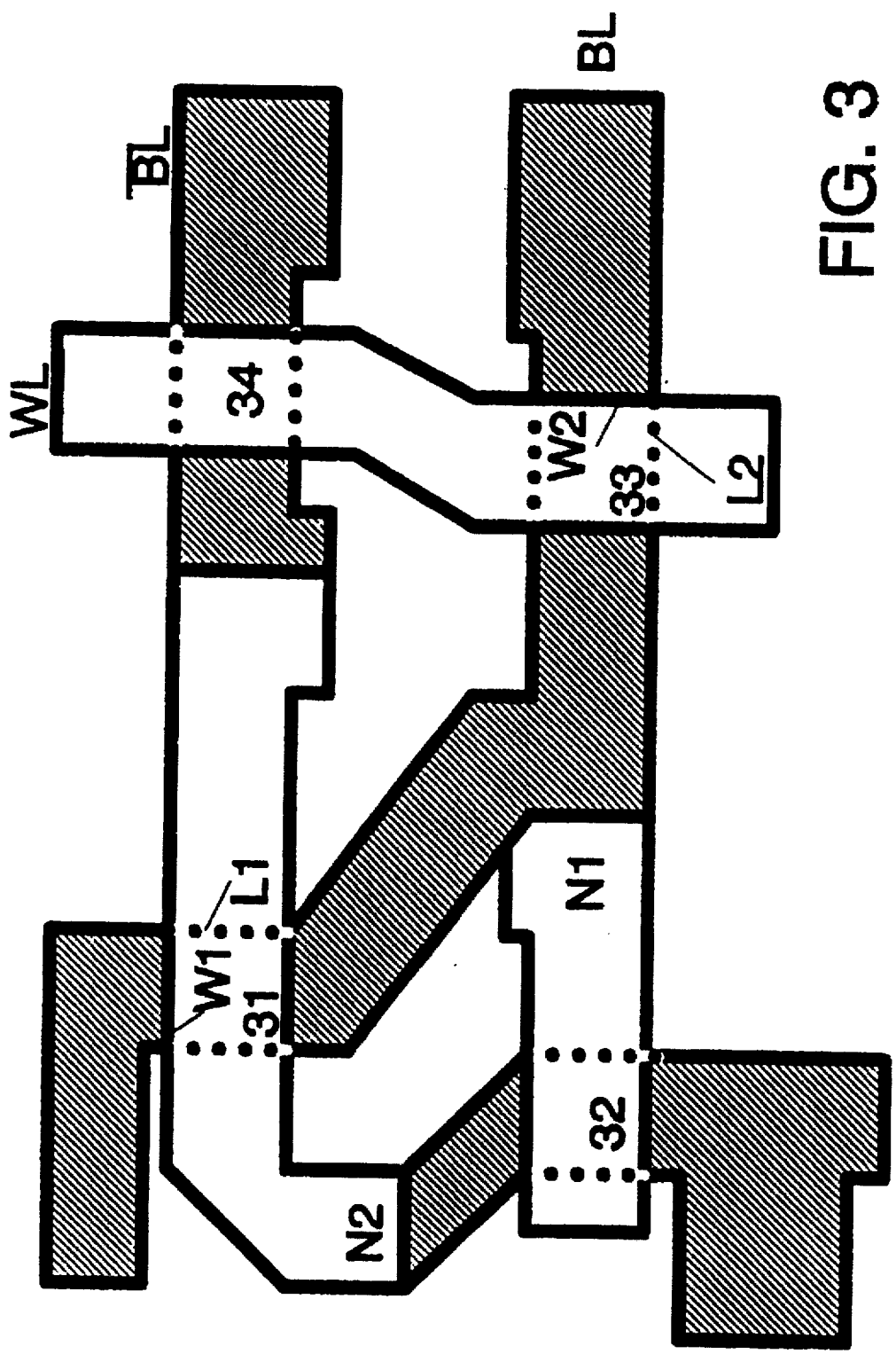
FIG. 3 shows the layout of a memory cell, based on the present invention in which minimum gate width and gate length are used.

In this invention, a higher threshold voltage is used for the transmission gates 13, 14 than that of the pull-down NMOS 11, 12 in FIG. 1; and a higher threshold voltage is used for the transmission gates 23, 24 than that of the-pull-down NMOS 21, 22 in FIG. 2. Gates of minimum length and minimum width or nearly equal width-to-length ratio are used for all the MOSFETs. As a limit, the width-to-length ratio (W1/L1 in FIG. 3) of the gates of the pull-down MOSFET is less than 2.5 times the width-to-length ration (W2/L2 in FIG. 3) of the transmission gates. A possible layout is shown in FIG. 3 which corresponds to the circuit of FIG. 1.

The drain to source voltage drop $V_{DS}$ across a MOSFET conducting a current $I_D$ is given as:

$$I_D \cong KP(W/L)(V_{GS}-V\text{th})V_{DS} \qquad (1)$$

where KP is a transconductance parameter equal to the product of mobility u and specific gate capacitance $C_{ox}$. W is the gate width and L is the gate length. It can be seen that for the same W/L ratio, an increase in Vth of the transmission gate increases the ratio of the $V_{DS}$ of the transmission gate to the $V_{DS}$ of the pull-down NMOS, hence decreasing the node voltage N1 or N2.

The threshold voltage of an NMOS is given by the following expression:

$$V_{th}=\phi_{GC}-2\phi_f-Q_{ss}/C_{ox}-Q_{BO}+\gamma[(-2\phi_f+V_{SB})^{1/2}-(-2\phi_f)^{1/2}] \quad (2)$$

where p1 $\phi_{GC}$ is the work function difference between the gate and the channel, $2\phi_f$ is the surface potential, $Q_{ss}$ is the surface-state charge at the bulk-oxide interface, $Q_{BO}$ is charge density in the depletion layer of the channel at the onset of strong inversion, $\gamma$ is the body-effect coefficient and is equal to $$(2q\,\epsilon_{si}N_a)^{1/2}/C_{ox},$$

q is the charge of an electron, $\epsilon_{si}$ is the permittivity of silicon, $N_a$ is the background impurity concentration, $C_{ox}$ is the gate oxide specific capacitance and is equal to $\epsilon_{ox}/t_{ox}$, $\epsilon_{ox}$ is the permittivity of gate oxide, $t_{ox}$ is the gate oxide thickness.

From this equation, it can be seen that the threshold voltage can be changed by adjusting several physical parameters in this equation.

In this invention, it is proposed to vary the work function difference, the background surface impurity concentration and/or the gate oxide thickness to obtain the desired threshold voltage.

The work function difference is the difference in Fermi levels of the silicon and gate materials, and can be changed by doping the gate of the MOSFET with different conductivity type impurities. By changing the doping of a silicon gate from one heavily-doped conductivity-type (e.g. p-type) to a heavily-doped opposite conductivity-type (e.g. n-type), the work function difference can vary as much as one energy gap, i.e. 1.12V for silicon. For an NMOS, a p-type dopant such as boron decreases the work function difference between the gate and the n-type channel. Thus the threshold voltage of an NMOS with p-type, silicon gate is higher than the threshold voltage of an NMO with n-type silicon gate. Such a gate can be used to increase the threshold voltage of the NMOS pass transistors in the SRAM cell.

The threshold voltage can also be increased by using a thicker gate oxide due to decreased specific capacitance as shown in the above $V_{th}$ equation 2.

A thicker oxide also decreases the transconductance parameter KP, which is equal to u*$C_{ox}$, and thus effectively increases the threshold voltage, because a larger gate voltage is required to yield the same drain current as shown in Eq. 1. Therefore, the objects of this invention can be implemented by using a lower transconductance parameter KP for the pass transistor than that of the pull-down MOSFET through adjusting the thickness of each gate oxide.

The threshold voltage can most readily adjusted by ion implantation. The change in threshold voltage is equal to $Q_I/C_{ox}$, where $Q_I$ is the ion implantation dosage per unit area. When the implanted ions are of the same conductivity-type, as the background, the threshold voltage is increased. When the implanted ions are of the opposite conductivity-type as the substrate, the threshold voltage is decreased. Furthermore, the ion-implantation also changes the body effect.

The above methods can be used either to change the threshold voltage of the transmission gates 13, 14 in FIG. 1 or 23, 24 in FIG. 2. Conversely, the same principle can be used to decrease the threshold voltages of the pull-down transistors 11, 12 in FIG. 1 or 21, 22 in FIG. 2. The choice is based on practical considerations. For instance, the gate oxide thickness cannot be reduced to a value where the integrity of the oxide becomes unreliable.

The above methods of varying the threshold voltage can be adopted by changing one or more parameters.

FIG. 3 shows a possible layout based on the present invention. The layout corresponds to the circuit diagram of FIG. 1. In this layout, the areas 31 and 32 correspond to the pull-down MOSFETs 11 and 12 respectively. The areas 33 and 34 correspond to the pass transistors 13 and 14 respectively. Note that the gate length L, (shown as dotted lines), and the gate width W, (shown as the line sections bounded between the dotted lines) of all the transistors are all of equal minimum dimensions. While the figure is drawn with equal gate length and gate width, the W/L ratios need not be exactly equal to one. So long as the W/L ratio of the pull-down MOSFETs is approximately the same as the W/L ratio of the pass transistors within a factor of 2.5, this feature is within the scope of this invention.

While the foregoing descriptions are devoted to resistive loads and CMOS structures, the techniques apply equally to other types of memory cells. Memory cells such as those using a depletion-mode load, a pre-charged load and ferroelectric load are also within the scope of this invention.

What is claimed is:

1. A semiconductor static memory cell comprising:

two cross-coupled inverters with a first inverter and a second inverter, each having a pull-up load device and a pull-down MOSFET with a drain, a source and a gate, an output node of the first inverter of said cross-coupled inverters, where the drain of said pull-down MOSFET is connected to the load device, being coupled to the gate of the MOSFET of the second inverter of said cross-coupled inverters, an output node of the second inverter of said cross-coupled inverters being coupled to the gate of the MOSFET of said first inverter, a first MOSFET pass transistor having a gate connected to a word line, and two other electrodes, a source and a drain, connected between the output node of said first inverter and a bit line, a second MOSFET pass transistor having a gate connected to said word line, and two other electrodes, a source and a drain, connected between the output node of said second inverter and a complementary bit line, said first and second MOSFET pass transistors having a threshold voltage higher than said pull-down MOSFET, and having a width-to-length ratio of the gate of the pull-down MOSFET less than 2.5 times the width-to-length ratio of the gate of the pass transistor.

2. A semiconductor static memory cell as described in claim 1, wherein said load device is a MOSFET of complementary conductivity-type channel to said pull-down MOSFET with a gate connected to the gate of said pull-down MOSFET.

3. A semiconductor static memory cell as described in claim 2, wherein the gate length and gate width of the pass transistor is the same as the gate length and gate width of the pull-down MOSFET respectively.

4. A semiconductor static memory cell as described in claim 3, wherein said gate length and said gate width are of minimum dimension for a state-of-art processing technology.

5. A semiconductor static memory cell as described in claim 1, wherein the threshold voltage of the pass transistor is increased by selectively implanting doping ions of same conductivity-type as the surface of the substrate of the pass transistor.

6. A semiconductor static memory cell as described in claim 1, wherein the threshold voltage of the pull-down MOSFET is decreased by selectively implanting doping ions of opposite conductivity-type to the surface of the surface of the pull-down MOSFET.

7. A semiconductor static memory cell as described in claim 1, wherein the threshold of the pass transistor is increased by making first gate oxide of the pass transistor thicker than second gate oxide of the pull-down MOSFET.

8. A semiconductor static memory cell as described in claim 1, wherein the threshold voltage of the pass transistor is increased by doping the gate of the pass transistor differently from the doping of the gate of the pull-down transistor.

9. A semiconductor static memory cell as described in claim 8, wherein the gate of the pass transistor is doped with p-type impurity and the gate of the pull-down transistor is doped with n-type impurity.

10. A semiconductor static memory cell comprising:

two cross-coupled inverters, each having a pull-up load device and a pull-down MOSFET with a drain, a source and a gate, an output node of the first inverter of said cross-coupled inverters, where the drain of said pull-down MOSFET is connected to the load device, being coupled to the gate of the MOSFET of the second inverter of said cross-coupled inverters, a second output node of the second inverter of said cross-coupled inverters being coupled to the gate of the MOSFET of said first inverter, a first MOSFET pass transistor having a gate connected to said word line, and two other electrodes, a source and a drain, connected between the output node of the said first inverter and a bit line, a second MOSFET pass transistor having a gate connected to said word line, and two other electrodes, the source and the drain, connected between the output node of said second inverter and a complementary bit line, said first and second MOSFET pass transistors having a lower transconductance parameter than the transconductance parameter of the pull-down MOSFET, and said gate of said pull-down MOSFET having a ratio of width to length of said gate of said pull-down MOSFET less than 2.5 times the ratio of width to length of the gate of said pass transistor.

11. A semiconductor static memory as claimed in claim 10, wherein, the adjustment of said conductance parameter is achieved by adjusting the thickness of the gate oxide of said first MOSFET pass transistor and said second MOSFET pass transistor.

* * * * *

UNITED STATES PATENT AND TRADEMARK OFFICE
CERTIFICATE OF CORRECTION

PATENT NO. : 5,703,392
DATED : December 30, 1997
INVENTOR(S) : Jeng-Jong GUO

It is certified that error appears in the above-identified patent and that said Letters Patent is hereby corrected as shown below:

On the title page, add Assignee: Utron Technology Inc., Hsin-Chu, Taiwan.

Signed and Sealed this

Ninth Day of June, 1998

Attest:

BRUCE LEHMAN

Attesting Officer

Commissioner of Patents and Trademarks